(12) United States Patent
Holscher

(10) Patent No.: US 6,639,320 B2
(45) Date of Patent: Oct. 28, 2003

(54) RETICLE FOR CREATING RESIST-FILLED VIAS IN A DUAL DAMASCENE PROCESS

(75) Inventor: Richard D. Holscher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/910,911

(22) Filed: Jul. 24, 2001

(65) Prior Publication Data

US 2002/0045107 A1 Apr. 18, 2002

Related U.S. Application Data

(62) Division of application No. 09/494,546, filed on Jan. 31, 2000.

(51) Int. Cl.[7] .......................... H01L 23/48; H01L 23/52; H01L 29/40
(52) U.S. Cl. .......................... 257/758; 257/750; 257/635
(58) Field of Search ................................ 257/750, 758, 257/635, 622

(56) References Cited

U.S. PATENT DOCUMENTS

| | | | |
|---|---|---|---|
| 5,702,982 A | * | 12/1997 | Lee et al. |
| 5,989,997 A | * | 11/1999 | Lin et al. |
| 6,323,123 B1 | * | 11/2001 | Liu et al. |
| 6,350,695 B1 | * | 2/2002 | Tae et al. |
| 6,406,995 B1 | * | 6/2002 | Hussein et al. |

* cited by examiner

Primary Examiner—Sheila V. Clark
(74) Attorney, Agent, or Firm—Dickstein Shapiro Morin & Oshinsky LLP

(57) ABSTRACT

An apparatus, system and method for fabricating a wafer utilizing a dual damascene process are described. A wafer-in-process, having conductive plugs within a first dielectric layer, a hard mask over the first dielectric layer, vias in a second dielectric layer which overlies the hard mask, and a photoresist material within the vias is further processed by a photolithographic device having transparent portions and radiant energy inhibiting portions. The photolithographic device is registered to the wafer-in-process to prevent radiant energy from being directly transmitted into the photoresist material overlaying the vias. This prevents the exposure of a portion of the photoresist material at a lower portion of the vias, thus protecting the hard mask layer and/or the conductive plugs from damage during a subsequent etching process. The exposed photoresist material is then removed.

8 Claims, 5 Drawing Sheets

RETICLE FOR CREATING RESIST-FILLED VIAS IN A DUAL DAMASCENE PROCESS

This application is a divisional of application Ser. No. 09/494,546 filed Jan. 31, 2000, the entirety of which is incorporated herein by reference.

FIELD OF THE INVENTION

The present invention generally relates to semiconductor fabrication. More particularly, the present invention relates to a photolithographic device adapted to protect electrical contact portions of a wafer-in-process, as well as an intermediate wafer product created during a dual damascene process.

BACKGROUND

In the manufacture of integrated circuits (ICs), microlithographic techniques are used to pattern one or more layers of conductive circuitry on a wafer. Referring to the wafer 10 shown in FIGS. 1–2, one typical microlithography patterning technique is a dual damascene process, which begins with the formation of openings 19 in a first dielectric material structure 18. A conductive material is then deposited over the dielectric structure 18 and within the openings 19. A chemical mechanical polish (CMP) is used to ablate the conductive material from a top surface of the dielectric structure, leaving plugs of conductive material 20 within the openings 19.

A hard mask layer 14 and a second dielectric material structure 12 are respectively positioned over the first dielectric structure 18. Vias 16 are formed in the second dielectric structure 12 and the hard mask layer 14, the vias 16 extending to the conductive plugs 20. A photoresist material is then deposited over the second dielectric structure 12 and within the vias 16. With a photolithographic device, such as a semiconductor mask or a reticle, the photoresist material is exposed and then developed. Specifically, the wafer-in-process is etched to create a large open area. The remaining photoresist is then removed, and a conductive material 62 is deposited within the vias 16 and over the dielectric structure. A CMP of the conductive material may be performed to prepare the wafer 10 for further processing. The wafer 10 thus formed may be incorporated within a semiconductor device, such as a memory cell in a DRAM.

A disadvantage in the above-described method is that all of the photoresist material in the vias 16 is exposed and developed. This uncovers the electrical contact portions adjacent to the hard mask layer 14 (i.e., the conductive plugs 20) during the subsequent etching of the wafer-in-process to create the large open area. This may lead to possible damage of the hard mask layer 14 and/or the conductive plugs 20.

While seen in the fabrication of all wafers, this disadvantage is more prevalent when large circuitry is to be formed, such as in a large metal bus or a large bonding pad. Using a conventional photolithographic device for developing the photoresist material in wafers, the depth of focus (DOF) of the radiant energy is greater than the depths of the vias 16, and hence all the photoresist material within the vias 16 may be exposed and developed, or removed.

There exists a need for a photolithographic device which protects the electrical contacts of wafers-in-process during subsequent wafer fabrication processes.

SUMMARY

An embodiment of the present invention provides a photolithographic device adapted for developing a portion of photoresist material on a wafer-in-process including vias within a dielectric layer overlain by the photoresist material. The device includes a radiant energy transparent portion and radiant energy blocking portions. The blocking portions are registered to the wafer-in-process to prevent direct radiant energy transmission to the photoresist material directly overlaying the vias.

Another embodiment of the present invention provides a system for fabricating a wafer including a source of radiant energy and a photolithographic device positioned between the source of radiant energy and a wafer-in-process including vias within a dielectric layer overlain with a photoresist material. The photolithographic device has a radiant energy transparent portion and radiant energy blocking portions. The blocking portions are registered to the wafer-in-process to prevent direct radiant energy transmission to the photoresist material directly overlaying the vias.

Another embodiment provides a method of fabricating a wafer including a plurality of conductive plugs in a first dielectric layer overlain by a hard mask layer and a second dielectric layer. The method includes forming vias in the second dielectric layer, each via extending to a corresponding conductive plug, applying a photoresist material to fill the vias and cover the second dielectric layer, and exposing a portion of the photoresist material so as to leave unexposed a second portion of the photoresist material located at a lower portion of the vias. The exposing includes using a photolithographic device which is adapted to prevent direct transmission of radiant energy to the photoresist material directly overlaying the vias.

Another embodiment provides a wafer-in-process including a first dielectric layer, at least one conductive plug within said first dielectric layer, a hard mask layer positioned atop said first dielectric layer, a second dielectric layer over said hard mask layer, at least one via extending through said second dielectric layer and said hard mask layer to said conductive plug, and photoresist material positioned only at a portion of said via adjacent said hard mask layer The foregoing and other objects, features and advantages of the invention will be more readily understood from the following detailed description of preferred embodiments of the invention, which is provided in connection with the accompanying drawings.

DETAILED DESCRIPTION OF PREFERRED EMBODIMENTS

Figure 1:
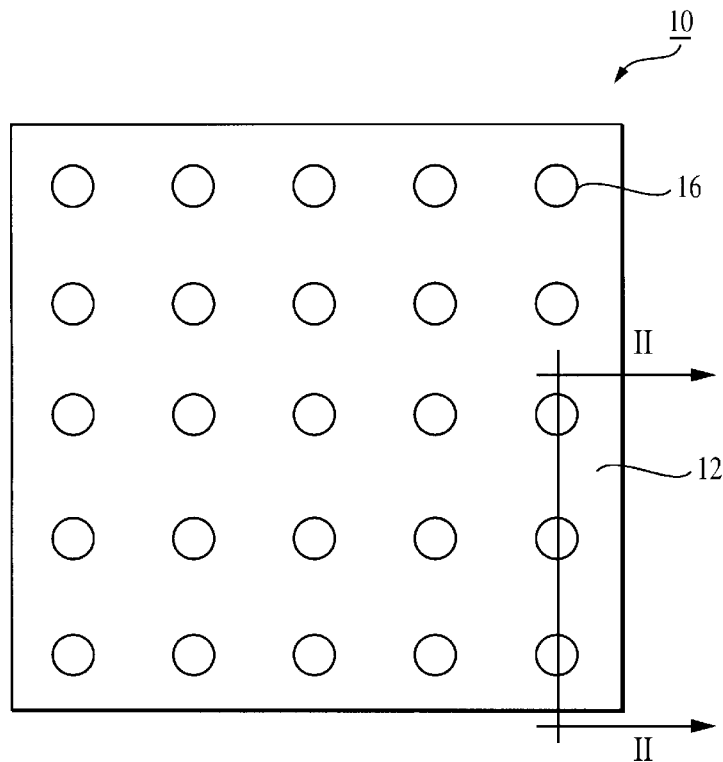
FIG. 1 is a top view of part of a portion of a wafer constructed in accordance with an embodiment of the present invention.
Figure 2:
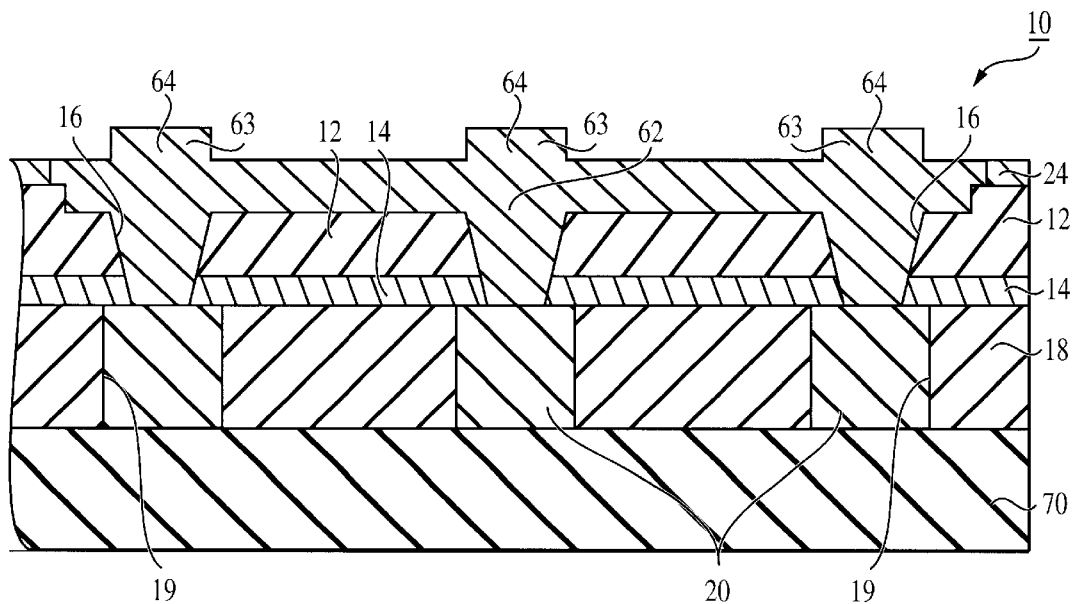
FIG. 2 is a cross-sectional view taken along line II—II of FIG. 1.

Referring to FIGS. 1–2, there is illustrated a portion of a wafer 10. FIGS. 1 and 2 show an upper portion of the wafer 10, which is built on a supporting substrate 70. The substrate 70 may have electronic devices or regions fabricated therein. The wafer 10 has a first dielectric layer 18, upon which is located a hard mask layer 14. Positioned atop the hard mask layer 14 is a second dielectric layer 12. Conductive plugs 20 formed of a conductive material fill openings 19 in the first dielectric layer 18. The conductive plugs 20 may connect with an active region or another conductor within the substrate 70. Vias 16 extend from a top surface of the second dielectric layer 12 to a bottom surface of the hard mask layer 14. Conductive material fills each via 16 and contacts a corresponding conductive material plug 20.

The dielectric layers 12, 18 may be formed of any suitable dielectric material, such as, for example, borophosphosilicate glass (BPSG), tetra ethyl orthosilane (TEOS) or plasmas enhanced TEOS (PETEOS). The conductive material 20 may be formed of a suitably conductive material, such as a metal. Suitable metals include copper, aluminum, gold, silver, titanium and the like. The hard mask layer 14 is formed of a material resistant to certain etchants. Preferably, the hard mask layer 14 is formed of silicon nitride. The wafer-in-process is chemical mechanical polished to prepare the surface for further processing.

Figure 3:
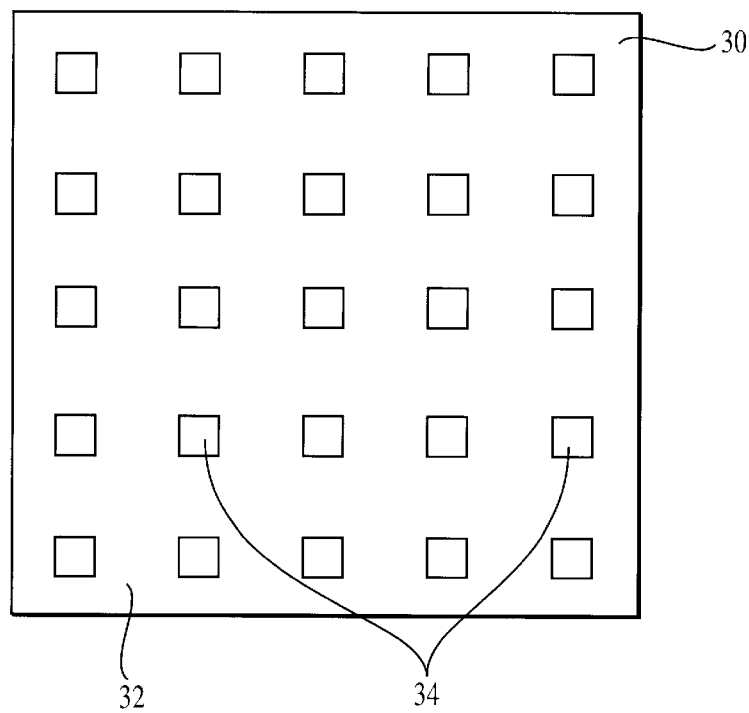
FIG. 3 is a top view of a photolithographic device constructed in accordance with an embodiment of the present invention.
Figure 4:
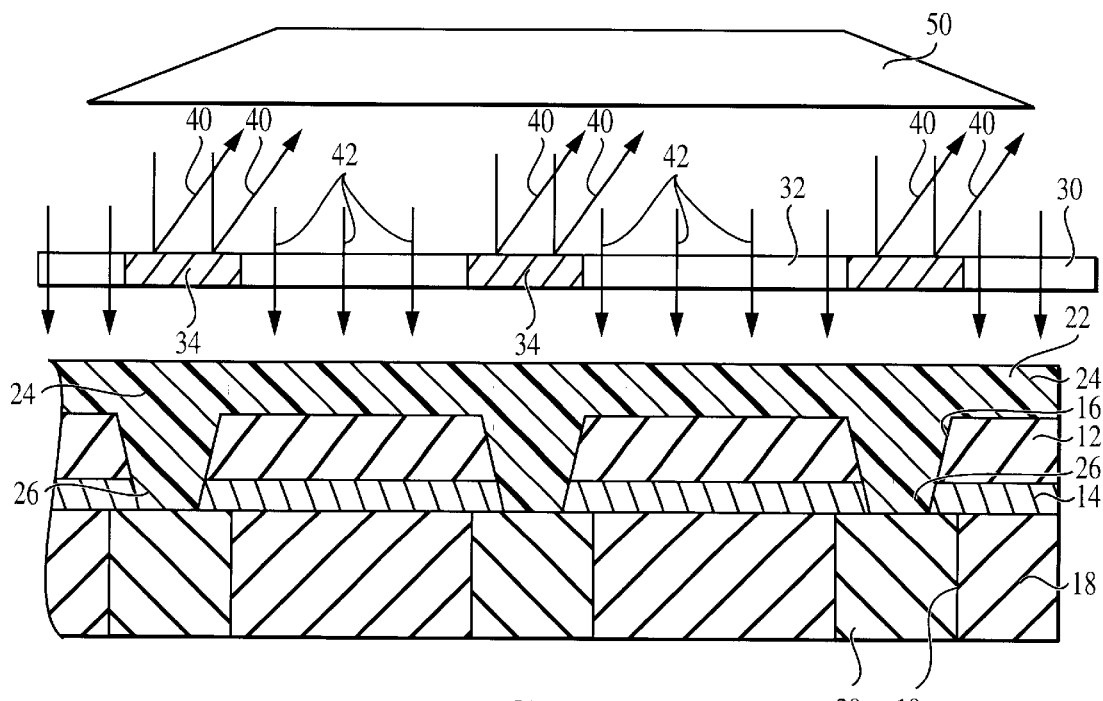
FIG. 4 is a cross-sectional view of the photolithographic device of FIG. 3 is use to form the wafer of FIG. 1.
Figure 5:
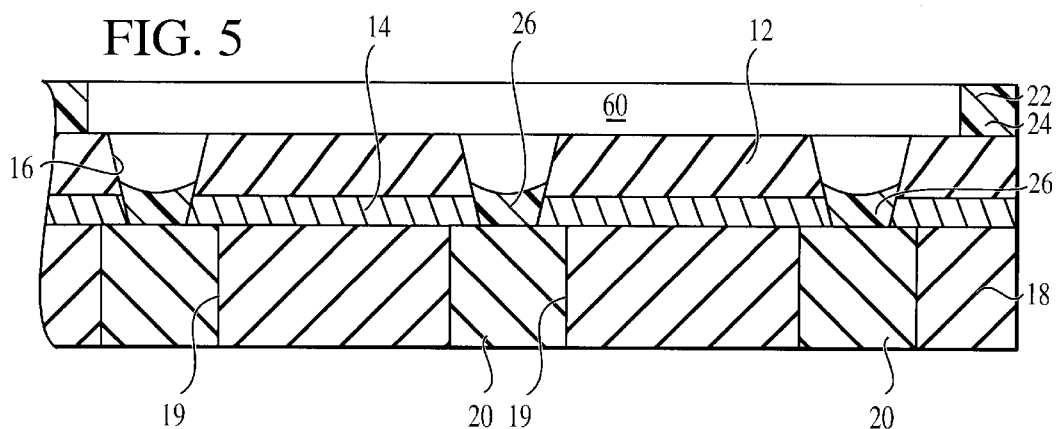
FIG. 5 is another cross-sectional view of the formation of the wafer of the FIGS. 1, 2, and 4.

A conventional process has been illustrated in FIGS. 1 and 2. FIGS. 3–5 illustrate the formation of the wafer 10 in accordance with an embodiment of the present invention. FIG. 3 illustrates a photolithographic device 30, such as a semiconductor mask or reticle, which includes a transparent substrate 32 and radiant energy inhibiting portions 34. The transparent substrate 32 is formed of quartz, glass, or any other material transparent to radiant energy. The inhibiting portions 34 are formed of a material which will prevent passage of radiant energy, such as chromium or other like opaque materials. Alternatively, a translucent or semi-opaque material may be used to inhibit the passage of radiant energy.

FIG. 4 shows the FIG. 2 structure at the point where a photoresist layer 22 has been applied to the dielectric layer 12 which has the vias 16 formed therein. As shown in FIG. 4, a radiant energy source 50 projects radiant energy toward the photolithographic device 30, which for simplicity's sake will hereinafter be called a reticle 30. A portion 40 of the radiant energy is inhibited by the inhibiting portions 34 from projecting onto and exposing portions of the photoresist material 22 while another portion 42 of the radiant energy extends through the reticle 30. The reticle 30 is registered to the wafer-in-process such that each inhibiting portion 34 obstructs the radiant energy portion 40 from direct transmission to the photoresist material 22 overlaying, and positioned in, a corresponding via 16.

By inhibiting direct projection of radiant energy to portions of the photoresist material 22 within or above the vias 16, a lower portion 26 of the photoresist material 22 remains unexposed, while an upper portion 24 of the photoresist material 22 still becomes exposed and may then be removed (FIG. 5). The lower portions 26 of the photoresist layer 22 protect the hard mask layer 14 and the conductive plugs 20 during a subsequent processing step performed on the wafer 10 (described in detail below). Strategic placement of the inhibiting portions 34 on the reticle 30 prevents the depth of focus (DOF) of the radiant energy from extending beyond the depth of the vias 16, allowing the lower photoresist portions 26 to remain in a lower quadrant of the vias 16. Preferably, the unexposed lower photoresist portions 26 should protect at least the conductive plugs 20, and more preferably also protect the hard mask layer 14. Thus, more preferably the unexposed lower photoresist portions 26 should extend from the conductive plugs 20 beyond the hard mask layer 14.

With reference to FIG. 4, by directing radiant energy through a properly registered reticle 30, an exposure pattern emerges on the wafer-in process in which the photoresist material 22 directly above the vias 16 has a reduced exposure relative to other portions of the photoresist material 22. Specifically, in the photoresist material 22 surrounding the vias 16, the normalized intensity (exposure/time) is about 0.90 to about 1.00. However, because of the inhibiting or opaque portions 34 directly blocking radiant energy from the vias 16, the normalized intensity at the photoresist material 22 overlaying the vias 16 is about 0.58 to about 0.34.

Figure 6A:
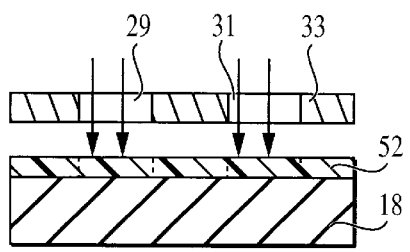
FIGS. 6A–L are a flow diagram illustrating the wafer fabrication process depicted in FIGS. 1, 2, 4 and 5.
Figure 6B:
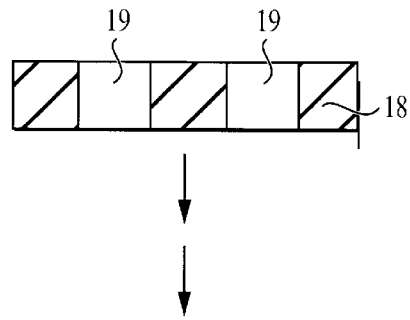
Figure 6C:
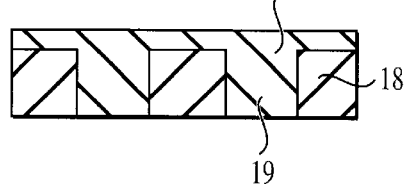
Figure 6D:
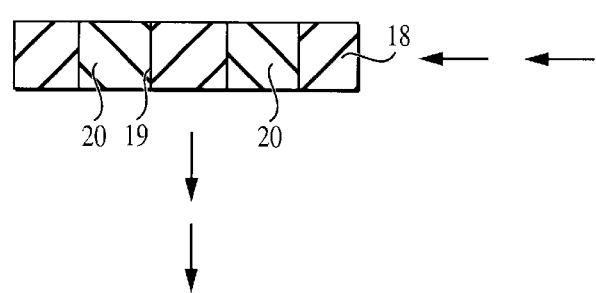
Figure 6E:
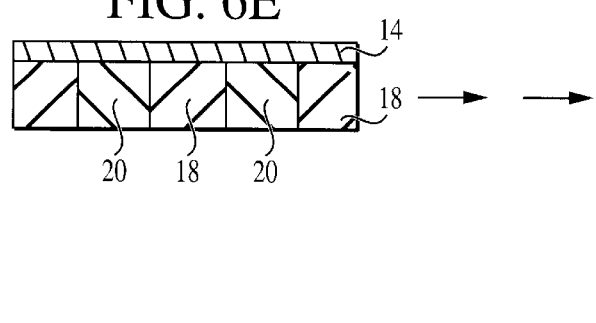
Figure 6F:
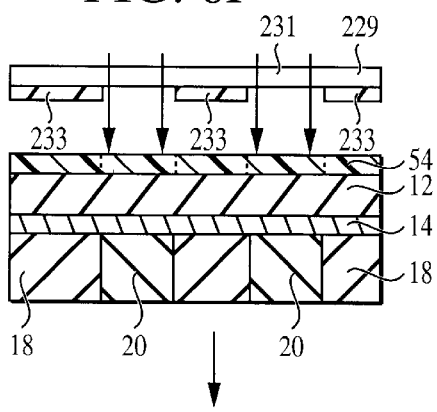
Figure 6H:
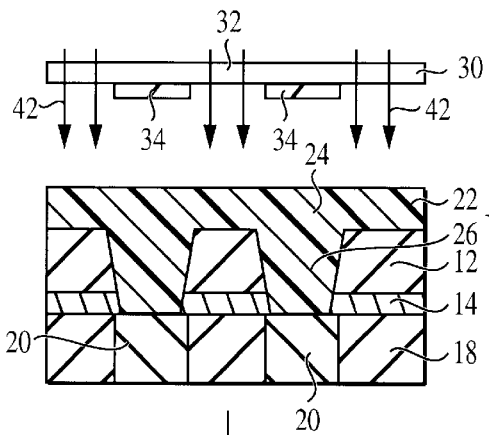
Figure 6G:
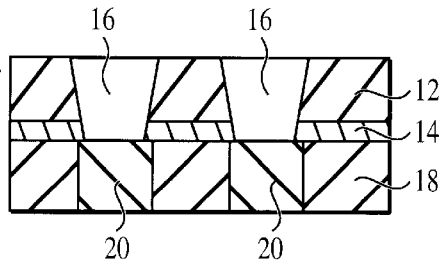
Figure 6I:
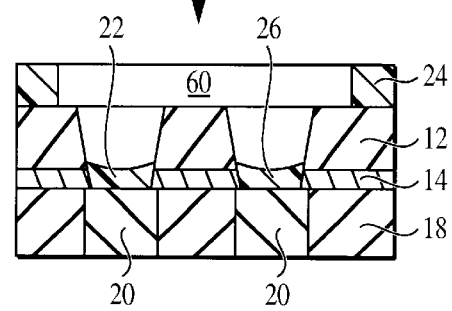
Figure 6J:
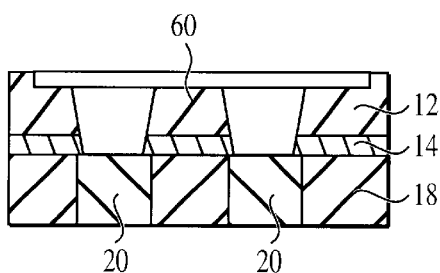
Figure 6L:
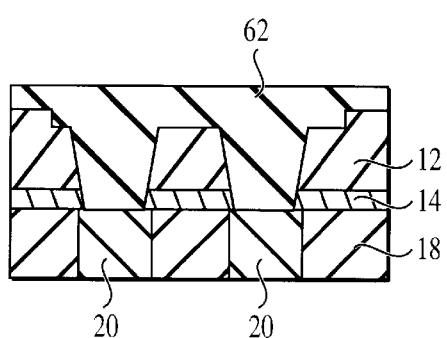
Figure 6K:
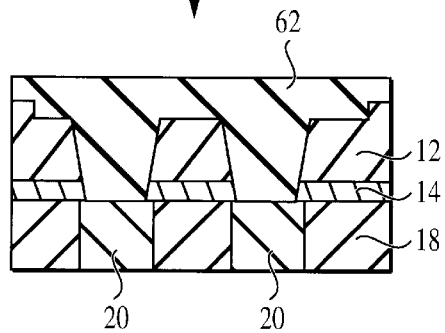
Figure 7:
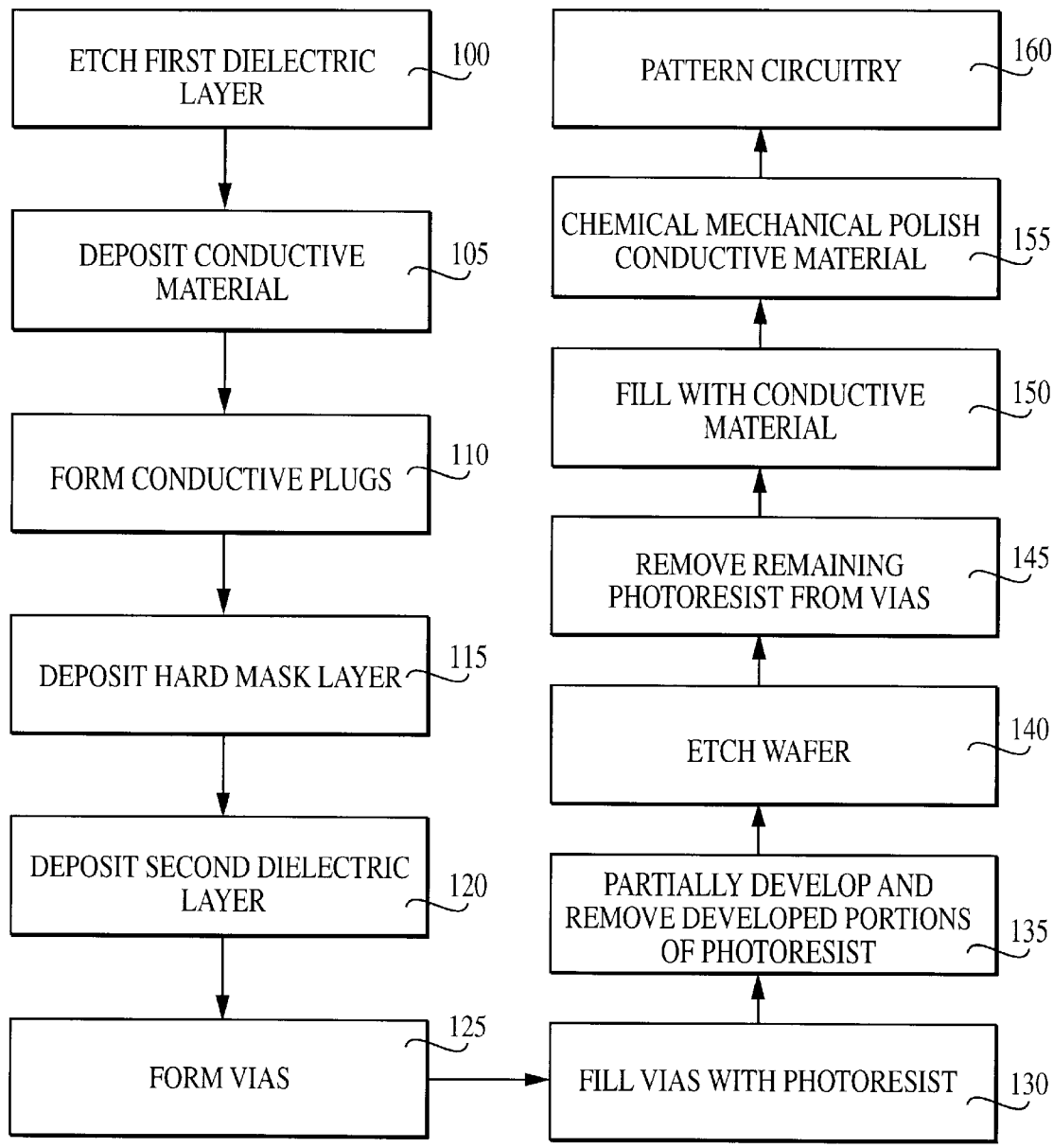
FIG. 7 is a flow diagram illustrating the wafer fabrication process depicted in FIGS. 1, 2 and 4–6.

FIGS. 6–7 illustrate a method of fabricating the wafer 10 in accordance with the present invention. Step 100 (FIGS. 6A, 7) is an etch of the first dielectric layer 18. Radiant energy projects through a transparent substrate 31 of a photolithographic device 29 onto a photoresist layer 52 on the first dielectric layer 18. Opaque or inhibiting portions 33 prevent radiant energy from extending to some parts of the photoresist layer 52. The radiant energy may be any suitable form capable of developing the photoresist layer 52, as is well known in the art. The radiant energy extending through the transparent substrate 31 forms openings in the photoresist layer 52. These openings in the photoresist layer 52 are in turn used in the etching of the first dielectric layer 18 to form the openings 19 therein (FIG. 6B).

After formation of the openings 19 in the first dielectric layer 18, conductive material 21 is deposited within the openings 19 and over the first dielectric layer 18 at step 105 (FIG. 6C). Conductive plugs 20 are then formed at step 110 (FIG. 6D). Preferably, a chemical mechanical polish (CMP) is performed on the conductive material 21 overlaying the first dielectric layer 18 to ablate that portion of the material 21, leaving behind the conductive plugs 20.

The hard mask layer 14 is then deposited over the first dielectric layer 18 and the conductive plugs 20 at step 115 (FIG. 6E). The second dielectric layer 12 is then deposited on the hard mask layer 14 at step 120 (FIG. 6F).

The vias 16 are formed in the second dielectric layer 12 and the hard mask layer 14 at step 125 (FIGS. 6F, 6G). Specifically, radiant energy is projected through transparent portions 231 of a photolithographic device 229 onto a photoresist layer 54 to expose portions of it. The layer 54 is then developed and openings therein are used to etch the second dielectric layer 12 and the hard mask 24 to form the vias 16. Radiant energy is inhibited from projecting through part of the device 229 to the wafer-in-process due to the positioning of opaque or inhibiting portions 233. The device 229 is registered to the wafer-in-process so as to position the openings in the photoresist layer 54 to form each via 16 to contact a corresponding conductive plug 20.

The vias 16 are filled with the photoresist material 22, which extends over a top surface of the second dielectric layer 12, at step 130 (FIG. 6H). As noted above, the photoresist material 22 includes a shallow portion 24 and a deep portion 26.

At step 135, a portion of the photoresist material 22 is exposed (FIGS. 6H, 6I). Specifically, the radiant energy 42 projects through the transparent portions 32 of a photolithographic device 30. The device 30 includes the inhibiting or opaque portions 34 which inhibit the radiant energy 42 from directly extending through the device 230 to the wafer-in-process. The device 30 differs from the device 229 in that the opaque portions 34 are positioned to inhibit radiant energy from directly reaching the vias 16, while the opaque portions 233 are positioned out of a direct line with the vias 16 and the radiant energy. In other words, the device 30 is the inverse of the device 229. The exposed portions of the photoresist 22 are removed, leaving an open space 60 and some remaining unexposed deep portions 26 of the photoresist 22 in the vias 16.

After removing the exposed portions of the photoresist 22, the wafer-in-process is etched at step 140 (FIG. 6J). Specifically, the top surface of the second dielectric layer 12 is etched to increase the surface area of the open space 60. After such processing, the remaining deep portions 26 of the photoresist material 22 are removed at step 145.

The vias 16 and the open space 60 are then filled at step 150 with the conductive material 62 (FIG. 6K). A portion of the conductive material 62 is ablated through chemical mechanical polishing at step 155 (FIG. 6L) to prepare the surface for further processing.

The described embodiments provide protection for the conductive plugs 20 and the hard mask layer 14 during etching of the open space 60 by the simple expedient of leaving some photoresist 22 at the bottom of the vias 16 when photoresist patterning the area for etching the second dielectric layer 12 to produce the open space 60.

While the invention has been described in detail in connection with the preferred embodiments known at the time, it should be readily understood that the invention is not limited to such disclosed embodiments. Rather, the invention can be modified to incorporated any number of variations, alterations, substitutions or equivalent arrangements not heretofore described, but which are commensurate with the spirit and scope of the invention. For example, while portions 33, 34, and 233 are described as opaque, translucent, semi-opaque or like materials capable of keeping the radiant energy DOF less than the depth of the vias 16 may be used. Accordingly, the invention is not to be seen as limited by the foregoing description, but is only limited by the scope of the appended claims.

What is claimed as new and desired to be protected by Letters Patent of the United States is:

1. A wafer-in-process comprising:
   a first dielectric layer having at least one opening extending therethrough in which is positioned conductive material;
   a hard mask layer overlaying said first dielectric layer and contacting said conductive material;
   a second dielectric layer overlaying said hard mask layer, said second dielectric layer including at least one via extending through said hard mask layer to said conductive material; and
   photoresist material positioned only at a lower portion of said via and covering said conductive material, said photoresist material serving to protect said conductive material and said hard mask layer during steps of fabricating said wafer-in-process.

2. The wafer-in-process of claim 1, wherein said photoresist material extends above said hard mask layer in said via.

3. The wafer-in-process of claim 2, wherein said hard mask layer comprises silicon nitride.

4. The wafer-in-process of claim 3, wherein said first dielectric layer includes a plurality of openings, each said opening having conductive material therein, and said second dielectric layer includes a plurality of vias, each said via extending to a corresponding said opening.

5. A wafer-in-process comprising:
   a first dielectric layer having at least one opening extending therethrough in which is positioned conductive material;
   a hard mask layer overlaying said first dielectric layer;
   a second dielectric layer overlaying said hard mask layer, said second dielectric layer including at least one via extending through said hard mask layer to said conductive material; and
   photoresist material positioned only at a lower portion of said via and covering said conductive material and extending at a level higher than said hard mask layer, said photoresist material serving to protect said conductive material and said hard mask layer during steps of fabricating said wafer-in-process.

6. The wafer-in-process of claim 5, wherein said hard mask layer comprises silicon nitride.

7. The wafer-in-process of claim 5, wherein said first dielectric layer includes a plurality of openings, each said opening having conductive material therein.

8. The wafer-in-process of claim 7, wherein said second dielectric layer includes a plurality of vias, each said via extending to a respective one of said plurality of openings.

* * * * *